May 12, 1964 R. C. GRIMSINGER 3,132,982

METHOD OF BENDING PRINTED ELECTRICAL CIRCUIT PANELS

Original Filed Dec. 3, 1959

INVENTOR.
RAYMOND C. GRIMSINGER

BY Gene W. Arant

ATTORNEY

1

3,132,982

METHOD OF BENDING PRINTED ELECTRICAL CIRCUIT PANELS

Raymond Charles Grimsinger, 27039 Grayslake Road, Palos Verdes Estates, Calif.

Original application Dec. 3, 1959, Ser. No. 857,194, now Patent No. 2,998,475, dated Aug. 29, 1961. Divided and this application July 26, 1961, Ser. No. 126,903
2 Claims. (Cl. 156—211)

The present invention relates to a method of making printed electrical circuit panels having angularly disposed sections, in which the metallic circuits are continuous on the inner surface of the panel at the angular juncture between adjacent sections.

This application is a division of my copending application Serial No. 857,194, filed December 3, 1959, now U.S. Patent No. 2,998,475, granted August 29, 1961.

In constructing electronic equipment utilizing printed circuit panels it is often desirable to form some of the panels in other than a flat configuration. For example, it may be desired to fabricate a circuit panel which is bent in two or more places to form the outer walls of a box, with the thin metallic strips that constitute the circuitry being supported on the inner surfaces of the panel. Structures of this type provide good strength characteristics and also conserve space, which is thus fully utilized by the electrical circuits.

One technique which has heretofore been used in fabricating circuit panels of the above type involves cutting both the mounting board and the thin metallic strips on its surface, and thereafter forming a right-angled structure in which the circuit strips are soldered together while the mounting board portions are fastened by other suitable means. This technique has been found highly unsatisfactory for reasons which hardly require discussion.

Another technique has heretofore been used with some degree of success on printed circuit panels of the flush type. In the flush type of circuit panel the surfaces of the metallic conductor strips are flush with the surfaces of the intervening portions of the mounting board. The particular method of forming a right-angled structure with this type of panel was to first cut the mounting board on its reverse side, making a cut of sufficient depth so that it came very close to the thin metallic strips embedded in the opposite surface but without actually touching them. Thereafter the thin metallic strips and the mounting board portions between them, lying in the same plane, were bent simultaneously. This method of fabricating right-angled panels of the flush type involved the bending of such thin sections of material that both the mounting board and the metallic conductor strips were often broken, requiring cumbersome repairs. Furthermore, the flush type of panel is too expensive as well as being unsatisfactory in other respects.

In the type of printed electrical circuit panel which is now standard, the surface of the mounting board is flat and the metallic conductor strips extend above it. The mounting board is originally prepared of relatively rigid plastic laminate material, and one surface is copper clad. Then the copper surface is etched by any one of several standard processes so as to eliminate the undesired portions of the copper, leaving the desired printed circuit configuration thereon. Thereafter, if a panel structure having two angularly disposed portions is to be fabricated, a bend-

2 ing operation or some equivalent process must be performed.

Unfortunately, the laminated plastic mounting board which is generally used is of such rigidity that it can be bent very little without breaking. Furthermore, the thickness of the metallic conductor strips is generally only two or three one-thousandths of an inch, hence they are easy to break but extremely difficult to repair.

The metallic conductor strips and the plastic mounting board of the standard circuit panel do not lie in a common plane, hence it is impossible to bend them concurrently without imposing a most undesirable mechanical strain on one or the other. At the same time, if the plastic mounting board were to be entirely cut away at the bending point, the very delicate metallic strips which remain would be exposed to almost certain damage.

One object of the invention, therefore, is to provide a printed electrical circuit panel having angularly disposed sections, which is easily and inexpensively constructed.

Another object of the invention is to provide a reliable and economical process for fabricating circuit panels of the above type.

A further object of the invention is to provide a method for bending printed electrical circuit panels of the standard type, in which the delicate metallic conductor strips are fully protected from damage.

The above and other objects of the invention will be more fully understood from the following description considered in conjunction with the accompanying drawing, in which.

Figures 1, 2, 3, 4, 5, 6, 7:
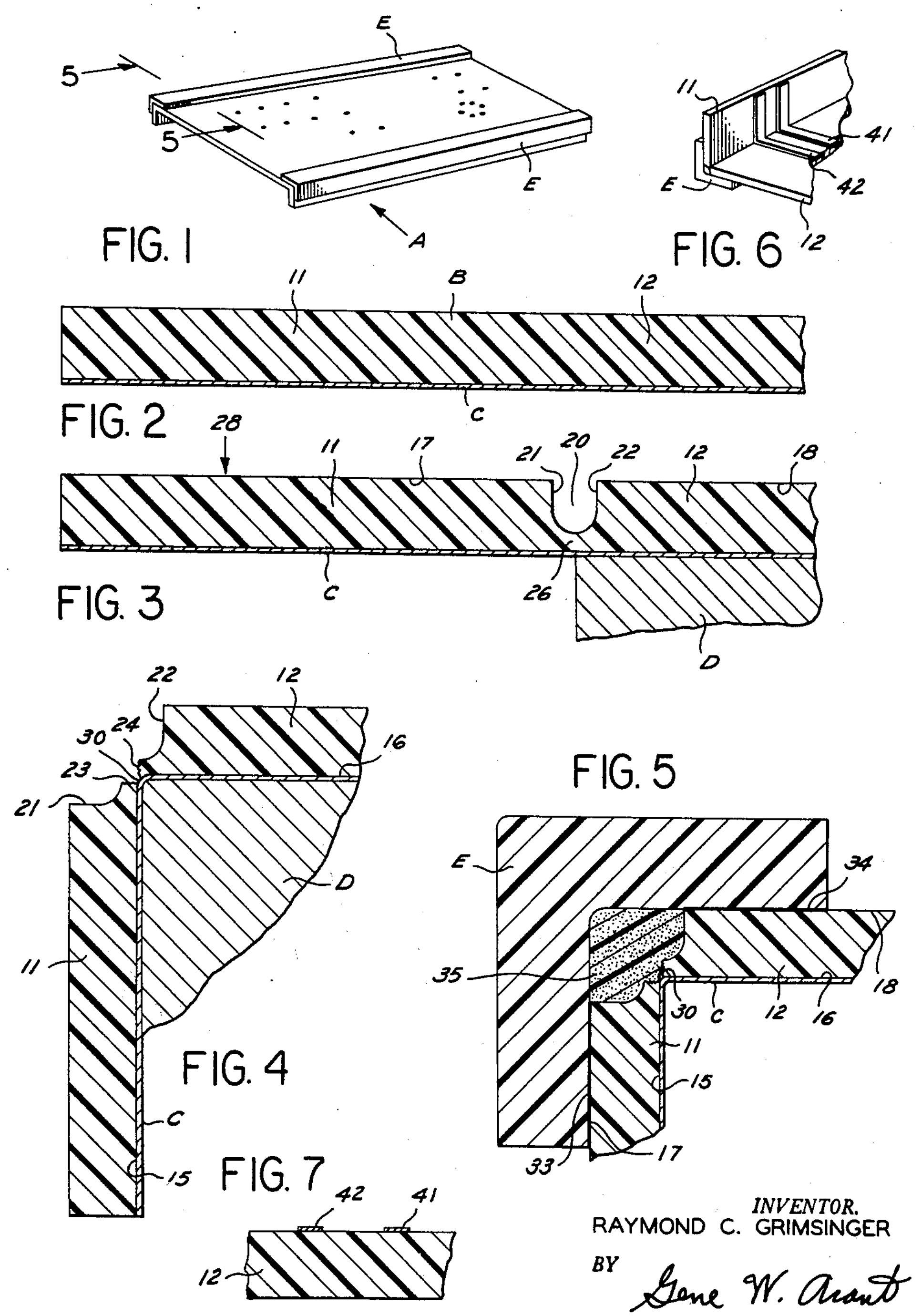
FIGURE 1 is a perspective view of a printed electrical circuit panel provided in accordance with the invention.
FIGURE 2 is a cross-sectional view of a portion of the panel prior to the bending operation.
FIGURE 3 is a cross-sectional view like FIGURE 2 illustrating preparations for bending.
FIGURE 4 is a cross-sectional view like FIGURES 2 and 3, illustrating the condition of the panel after bending has been completed.
FIGURE 5 illustrates the completed structure of the bent portion of the panel.
FIGURE 6 is a partial perspective view illustrating the continuity of the metallic conductor strips over the inner surface of the bent portion of the panel.
FIGURE 7 is an end view of the structure of FIGURE 6 showing the raised position of the metallic strips on the mounting board.

According to the invention the process used is as follows. First, the plastic mounting board is cut on its reverse side at the desired bending point, but the depth of cut is limited so that there is an adequate amount of the plastic material remaining to give good structural support to the metallic conductor strips. Next, the panel is placed on a metal form block with the metallic conductor strips being in supporting relationship with the flat face of the form block. The desired bending point for the panel is placed over a sharp edge of the form block. Then, bending of the panel is progressively forced until the metallic conductor strips conform exactly to the surface of the form block in the area of the bend. The progressive bending is at all times controlled so that the metallic conductor strips are fully protected between the metal form block and the plastic mounting board, and when the bending moment on the mounting board portion underneath the back cut increases toward its limit value the mounting board is caused to intentionally fracture underneath the back cut so as to avoid placing undesired compressive stress on the adjoining portions of the metallic conductor strips.

The present invention provides a new end product whose existence is made possible through the use of the new process. In the drawing successive steps of the process are illustrated in FIGURES 2, 3, 4 and 5.

FIGURE 2 illustrates a relatively rigid plastic board B which may, for example, be comprised of glass reinforced epoxy laminate. On its under surface the board B is provided with a metal coating or metallic strips C. The left hand portion of board B is designated by numeral 11 while the right hand portion is designated by numeral 12. In accordance with standard techniques of the industry the metal coating C is etched so as to provide a system of thin metallic strips, and the novel method of the present invention is applied thereafter.

As shown in FIGURE 3 board B is cut on its reverse side at 20 to provide a board portion 26 of reduced thickness. Board section 11 has a flat end 21 on one side of the cut, and board section 12 has a flat end 22 on the other side of the cut. Board B is then placed on a metal form block D in such a position that strips C underneath board section 12 are firmly supported on the upper flat surface of form block D, while cut portion 20 of the board is symmetrically disposed above the vertical edge of the form block. Board section 11 extends horizontally outward into a free space in which it can be manipulated or bent downwardly, as indicated at arrow 28. Board section 12 is maintained on the surface of form block D by engaging its upper surface 18 with a suitable jig. A separate jig is placed upon the upper surface 17 of board section 11 prior to exerting downward pressure thereon.

As downward pressure is exerted on board section 11 the metallic strips C are caused to bend around the sharp corner of metal form block D in exact conformance with the configuration thereof. Metallic strips C are permitted to bend in their own plane, and at the point where bending occurs are fully protected by being pressed between the board B and form block D. At the same time, board portion 26 is forced to bend on a much larger radius. Since board B is relatively inelastic the board portion 26 has a tendency to fracture.

In accordance with the novel method of the invention the board portion 26 is intentionally caused to fracture as the bending of board B takes place.

FIGURE 4 illustrates the position of board sections 11 and 12 after the bending action has been completed. Due to the complete or partial fracture of board portion 26 the board section 11 has a jagged upper end portion 23 resulting from the fracture, while board portion 12 has a jagged end portion 24 resulting from the fracture.

Typical thickness values of the materials involved may be as follows. The thickness of plastic board B may be 60 one-thousandths of an inch, or 60 mils. Reduced-thickness portion 26 of the board may have a thickness of 15 mils. The thickness of metallic strips C is typically 2.7 mils. Note the depth of cut 20 is adjusted so that board portion 26 retains about six times the thickness of metallic strips C.

In FIGURE 4 for purpose of illustration the board portion 26 is shown as being separated into two parts by a complete fracture. In actual practice this seldom occurs. Rather, board portion 26 tends to fracture at several different places on its reverse side, but few if any of these fractures extend all the way to the under surface of the board.

The significant thing to note is that the main objective during bending of board B is to protect the metallic strips C from being stretched or otherwise damaged. If board B were to fracture throughout its length before the bending were completed, this would then leave the board sections 11 and 12 mechanically interconnected only by the delicate metallic strips C, presenting a serious danger of pulling and breaking the metallic strips. The back cut 20 is fairly wide at the bottom so that the board portion 26 has an opportunity to initially fracture at several different places on its upper surface. When board section 11 has been bent so that it is in full contact with form block D the holding jigs both for board section 11 and for board section 12 are struck several times with a hammer. This insures substantial completion of the fracturing of board portion 26, and at the same time relieves residual tension which might cause the board to spring back toward its initial shape. Metallic strips C are usually copper and have a negligible tendency to resume their former shape.

The result of the bending process is that board sections 11 and 12 assume a position in which their inner surfaces 15 and 16 face toward each other at an angle, which in the example shown is approximately 90 degrees. The outwardly facing surfaces 17, 18, of the board extend inwardly of the board at 21 and 22, on respective sides of the junction of the two flat board sections 11 and 12, and terminate at the reduced thickness portion 26 of the board. Board portion 26 while at least partially fractured nevertheless presents a supporting surface 30 at the corner where board sections 11 and 12 are joined together, hence the metallic strips extend uninterruptedly and in a relatively unstressed condition over the corner surface between the two board sections.

FIGURE 5 illustrates the completed assembly. A support member E which is preferably of the same material as board B is integrally formed as an angle strip. A suitable adhesive material 35 is used to fill in the space between the ends of board sections 11, 12. The adhesive material is also used to bond the reverse side 17 of board section 11 to the support member E at 33, and to bond the reverse side 18 of board section 12 to support member E at 34. When the board B and support member E are made of epoxy it is convenient to use epoxy adhesive, with the entire assembly being allowed to copolymerize over a period of 24 or 48 hours at room temperature, or over a period of about an hour or less when suitably heated.

FIGURE 1 illustrates a complete circuit panel A in accordance with the invention, having two right-angled side portions each supported by an angle strip E. It will readily be seen that this type of structure provides good mechanical strength characteristics so that the panel A may be used as a chassis in lieu of the usual sheet metal.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

I claim:

1. The method of bending a laminated panel for making a printed electrical circuit panel having two adjacent flat board sections disposed in angular relationship, and a thin metallic coating on the inwardly facing surfaces thereof which extend uninterruptedly and in a relatively unstressed condition over the corner surface therebetween, which comprises selecting a flat plastic board having a metal coating on one surface thereof, cutting the other surface of said board along a straight line to provide a board portion of reduced thickness, bending said board about an axis lying beneath said reduced thickness portion and within the plane of said metallic coating until said reduced thickness portion is at least partially fractured, filling in the opening in the board formed by the cutting and bending with an adhesive filler, and attaching a support member to said other surface of said board on both sides of said cutting line.

2. The method of bending a laminated panel for making a printed electrical circuit panel having two adjacent flat board sections disposed in angular relationship and a system of thin metallic strips on the inwardly facing surfaces thereof which extend uninterruptedly and in a relatively unstressed condition over the corner surface therebetween, which comprises: selecting a flat plastic board having a system of thin metallic strips on one surface thereof; cutting the other surface of said board along a straight line to provide a board portion of reduced thickness; bending said board about an axis lying parallel to said reduced thickness portion and within the plane of said system of thin metallic strips until said reduced thickness portion is at least partially fractured; filling in the opening in the board formed by the cutting and bending with an adhesive filler, and attaching a support member to said other surface of said board on both sides of said cutting line.

References Cited in the file of this patent

UNITED STATES PATENTS

| | | |
|---|---|---|
| 2,041,974 | Sloan | May 26, 1936 |
| 2,293,184 | Weissert | Aug. 18, 1942 |
| 2,854,373 | Beach | Sept. 30, 1958 |

FOREIGN PATENTS

| | | |
|---|---|---|
| 1,137,048 | France | Jan. 7, 1957 |